(12) United States Patent
Sawaki (10) Patent No.: US 12,052,845 B2
(45) Date of Patent: Jul. 30, 2024

(54) ELECTRONIC CONTROL DEVICE (71) Applicant: Hitachi Astemo, Ltd., Hitachinaka (JP)

(72) Inventor: Takanori Sawaki, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 0 days.

(21) Appl. No.: 17/546,820

(22) Filed: Dec. 9, 2021

(65) Prior Publication Data
US 2022/0312630 A1 Sep. 29, 2022

(30) Foreign Application Priority Data

Mar. 24, 2021 (JP) ................. 2021-050552

(51) Int. Cl.
H05K 7/20 (2006.01)
H05K 5/00 (2006.01)
H05K 5/04 (2006.01)

(52) U.S. Cl.
CPC ......... *H05K 7/2039* (2013.01); *H05K 5/0047* (2013.01); *H05K 5/04* (2013.01); *H05K 7/20127* (2013.01)

(58) Field of Classification Search
CPC ...... H05K 7/2039; H05K 5/0047; H05K 5/04; H05K 7/20127; H05K 5/0052; H05K 7/20845

See application file for complete search history.

(56) References Cited

U.S. PATENT DOCUMENTS

| | | | | |
|---|---|---|---|---|
| 5,940,272 A | * | 8/1999 | Emori | H05K 7/20927 361/752 |
| 8,797,742 B2 | * | 8/2014 | Kawai | H05K 7/20409 361/705 |
| 9,277,681 B2 | * | 3/2016 | Kawai | H05K 7/20854 |
| 10,070,558 B2 | * | 9/2018 | Campbell | H05K 5/068 |
| 11,166,396 B2 | * | 11/2021 | Ito | H05K 1/18 |
| 2009/0073654 A1 | * | 3/2009 | Beam | H05K 7/20418 165/104.34 |
| 2009/0207382 A1 | * | 8/2009 | Hsiao | G03B 21/16 353/58 |
| 2010/0124024 A1 | * | 5/2010 | Nishiuma | H05K 7/20509 361/705 |
| 2011/0013370 A1 | * | 1/2011 | Oota | H01L 25/16 361/752 |

(Continued)

FOREIGN PATENT DOCUMENTS

| | | | | | |
|---|---|---|---|---|---|
| JP | H07312491 A | * | 11/1995 | | H05K 5/02 |
| JP | H11266089 A | * | 9/1999 | | H05K 7/20 |

(Continued)

*Primary Examiner* — Abhishek M Rathod
(74) *Attorney, Agent, or Firm* — Rankin, Hill & Clark LLP (57) ABSTRACT

A circuit board of an electronic control device has a surface to which a connector is attached and on which a heat generating component is mounted. A metal casing that stores therein the circuit board has an opposing surface that faces the surface of the circuit board on which the heat generating component is mounted. A first fin that protrudes toward the surface on which the heat generating component is mounted is provided on the opposing surface of the casing. The first fin overlaps the heat generating component in the thickness direction of the circuit board.

7 Claims, 5 Drawing Sheets

(56) References Cited

U.S. PATENT DOCUMENTS

| | | | | |
|---|---|---|---|---|
| 2011/0228498 A1* | 9/2011 | Kawai | ................ | H05K 7/20854 |
| | | | | 361/752 |
| 2018/0226319 A1* | 8/2018 | Yamamoto | .......... | H01L 23/3675 |
| 2022/0394881 A1* | 12/2022 | Tsuyuki | ............... | H05K 5/0056 |

FOREIGN PATENT DOCUMENTS

| JP | 2001-053480 A | 2/2001 |
|---|---|---|
| JP | 2013-197405 | 9/2013 |

* cited by examiner

ELECTRONIC CONTROL DEVICE

FIELD OF THE INVENTION

The present disclosure relates to an electronic control device that includes a casing formed in a shape that dissipates heat from a heat generating component to the exterior.

BACKGROUND

Loaded in a vehicle are electronic control devices, such as an engine control unit and a control unit for an automatic transmission. The electronic control device includes a circuit board on which electronic components are mounted. The electronic components include heat generating components which generate heat in accordance with the operation, such as an arithmetic processing unit (a CPU), and semiconductor switching elements. JP 2013-197405 A discloses a technology that dissipates heat generated by a heat generating component to an atmospheric air via a casing that stores therein a circuit board.

The casing of an electronic control device disclosed in JP 2013-197405 A includes a box-shape casing integrally formed as a single component by metal material, and a cover that covers the circuit board contained in the casing. A heat dissipating portion is formed on the casing at a position which faces the heat generating component. The heat dissipating portion is thinner than the surrounding regions. The heat dissipating portion includes a protrusion that protrudes from the interior of the casing to a heat generating site, and a recess that is opened to the exterior of the casing at the position of the protrusion in the thickness direction.

Heat from the heat generating component is likely to be transferred to the protrusion near the heat generating component, and the heat that is transferred to the recess is dissipated from the recess of the thin heat dissipating portion and from the circumferential edge of the heat dissipating portion.

Meanwhile, as described above, the recess is provided in the outer surface of the casing at the position of the protrusion in the thickness direction. By providing the recess, the heat dissipation performance increases, and the thickness of the casing can be made uniform. When the thickness of the casing is designed as uniform, the shape forming easiness of the metal casing can be maintained. When, however, the recess is formed in the outer surface of the casing, the shape of the outer surface of the casing becomes complex, and thus the manufacturing costs of the metallic mold for shaping the casing increase. An electronic control device is desired which has a simple outer surface of a casing, and which also has a heat dissipation performance.

An objective of the present disclosure is to provide an electronic control device that includes a casing which has an outer surface that employs a simple structure, and which has a high heat dissipation performance.

SUMMARY OF THE INVENTION

The casing of an electronic control device includes an opposing surface that faces the one surface of a circuit board. A first fin that protrudes toward the one surface of the circuit board is provided on the opposing surface of the casing. The first fin overlaps a high-heat generating component in the thickness direction of the circuit board. Hence, heat generated from the high-heat generating component is transferred to the first fin located right below the high-heat generating component, and is dissipated from the casing to the exterior through the first fin.

In addition, since the first fin is a thin-plate shape, and the area of the tip surface of the first fin is small. If a convexity with a tip surface that has a predetermined dimension is provided like Patent Document 1, in order to maintain the easiness of shape forming, it becomes essential to provide a recess in an opposite side. In contrast, the first fin is in a thin-plate shape. In order to maintain the easiness of shape forming of the metal casing, it is unnecessary to form a recess corresponding to the first fin in an opposite surface of the opposing surface on which the first fin is formed. The opposite surface is a flat surface, simplifying the external shape of the casing.

Accordingly, an electronic control device that includes a casing which has an outer surface that employs a simple structure, and which has a high heat dissipation performance can be provided.

Preferably, a second fin that protrudes toward the one surface of the circuit board is provided on the opposing surface of the casing. As viewed along the thickness direction of the circuit board, the second fin is located between a high-heat generating component and a low-heat generating component. When the clearance between the casing and the circuit board is designed as a predetermined dimension so as to cause air in the casing to flow as convection flow, heat generated from the high-heat generating component flows toward the low-heat generating component by the convection flow. Hence, by providing the second fin between the high-heat generating component and the low-heat generating component, high-temperature air can be blocked. This prevents the low-heat generating component from being heated.

DETAILED DESCRIPTION OF THE EMBODIMENTS

Embodiments of the present disclosure will be described with reference to the accompanying figures.

Embodiments

Figure 1:
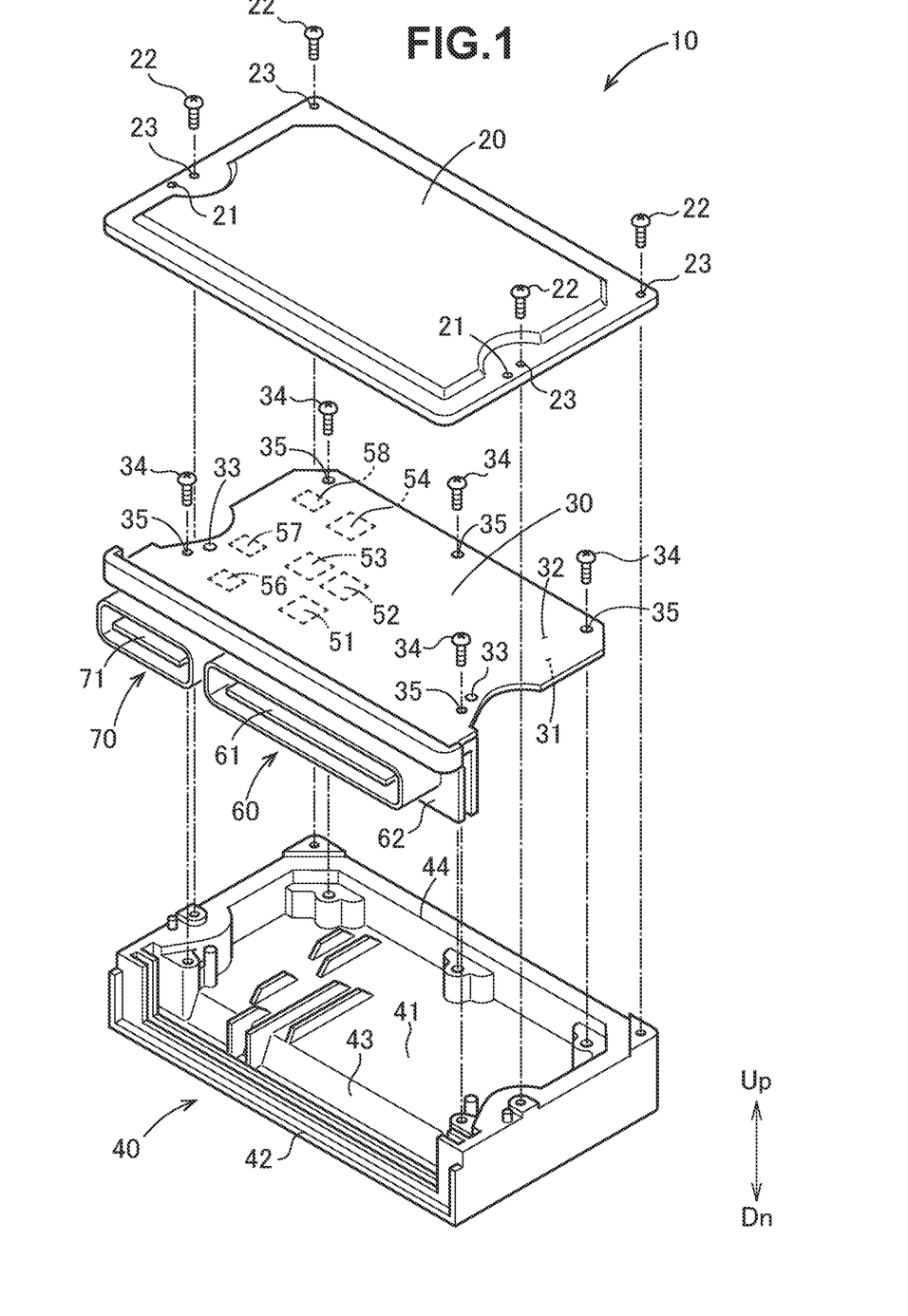
FIG. 1 is an exploded perspective view of an electronic control device according to an embodiment.

FIG. 1 illustrates an electronic control device 10 applicable to an engine control unit, etc. The electronic control device 10 includes a circuit board 30 on which electronic components are mounted, a metal casing 40 that stores therein the circuit board 30, and a cover 20 which is assembled with the casing 40 and which covers the circuit board 30. For the purpose of description, the thickness direction of the circuit board 30 will be defined as a vertical direction. In the figures, Up and Dn represent up and down, respectively. Note that the vertical direction does not correspond to the actual state of the electronic control device 10 loaded on a vehicle.

(Circuit Board)

The circuit board 30 is a printed-wiring circuit board in a rectangular shape, and for example, a wiring circuit pattern (unillustrated) is formed on a front or rear surface of a plate material formed of a glass epoxy resin, etc., or formed therein. Electronic components are electrically connected to the wiring circuit pattern.

More specifically, mounted on a lower surface 31 (one surface, a surface at the casing 40 side) of the circuit board 30 are a plurality of (e.g., four) high-heat generating components 51 to 54 that are electronic components (an arithmetic processing unit, a transistor, and an IC, etc.) which are likely to generate heat, and a plurality of (e.g., three) low-heat generating components 56 to 58 that are electronic components (a capacitor, and a coil, etc.) which generate heat lower than that of the high-heat generating component. Although the electronic components are mounted on an upper surface 32 (the other surface, a surface at the cover 20 side) of the circuit board 30, the illustration and description of such electronic components will be omitted.

Formed in the circuit board 30 are positioning holes 33 which position the circuit board 30 relative to the casing 40, and through-holes 35 through which respective screws 34 for fastening the circuit board 30 to the casing 40 can pass completely through.

(Connectors)

A first connector 60 and a second connector 70 which are directed toward the external side are attached to one edge of the lower surface 31 of the circuit board 30 in the lengthwise direction. The first connector 60 and the second connector 70 are connectable to respective connectors (unillustrated) at the vehicle side.

The first connector 60 includes a first terminal 61 that is electrically connected to the wiring circuit pattern of the circuit board 30, and a first base 62 that supports the first terminal 61. The first base 62 is formed in a plate shape, and is placed so as to be orthogonal to the lower surface 31 of the circuit board 30.

The second connector 70 includes a second terminal 71 electrically connected to the wiring circuit pattern of the circuit board 30, and a second base (unillustrated) that supports the second terminal 71. The second base is formed in a plate shape, and is placed so as to be orthogonal to the lower surface 31 of the circuit board 30.

(Cover)

The cover 20 is formed by sheet-metal processing and is formed of a lightweight and low-cost member in comparison with a metal material (a product formed by aluminum die casting). Formed in the cover 20 are positioning holes 21 for positioning the cover 20 to the casing 40, and through-holes through which respective screws 22 for fastening the cover 20 to the casing 40 can pass completely through.

(Casing)

Figure 2:
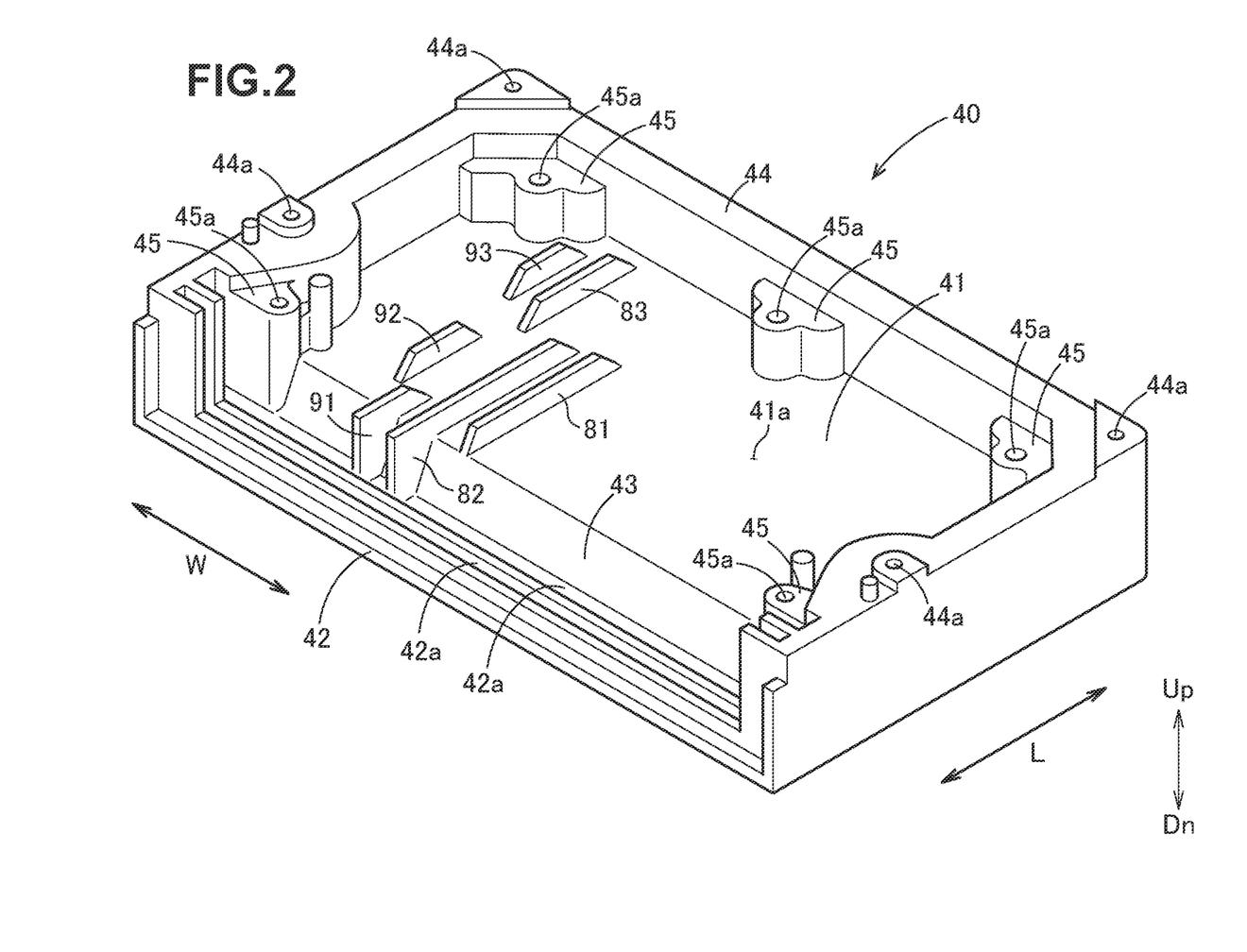
FIG. 2 is a perspective view of a casing in which a circuit board illustrated in FIG. 1 can be stored.

With reference to FIG. 1 and FIG. 2, the casing 40 is formed of a metal (by aluminum die casting) that has an excellent thermal conductivity, such as aluminum, and is formed in a box shape opened upwardly. More specifically, the casing 40 includes a main body 41 in a plate shape which faces the lower surface 31 of the circuit board 30, a support portion 42 which can support the first base 62 of the first connector 60 and the second base of the second connector 70, a connecting portion 43 that connects the support portion 42 and the main body 41, and a wall portion 44 that can surround the circuit board 30, and those are formed integrally to each other. The wall portion 44 is not formed at a location where the first connector 60 and the second connector 70 are placed.

The support surfaces 45 that support the circuit board 30 are provided at the internal four corners of the casing 40 and at the center of an edge at the opposite side to the first connector 60 and to the second connector 70. A female screw hole 45a that can be fastened with the screw 34 for fastening the circuit board 30 is formed in each support surface 45. Female screw holes 44a that can be fastened with the respective screws 22 for fastening the cover 20 are formed in the wall portion 44.

Grooves 42a and 42a in which the first base 62 of the first connector 60 and the second base of the second connector 70 can be fitted are formed in the support portion 42. The support portion 42 is located below the main body 41 (a direction becoming apart from the circuit board 30 with reference to the thickness direction of the circuit board 30). In other words, the support portion 42, the connecting portion 43, and the main body 41 are connected with each other like a shape with multiple steps.

(First Fin and Second Fin)

The main body 41 of the casing 40 includes an opposing surface 41 that faces the lower surface 31 (a surface on which the high-heat generating components 51 to 54 are mounted) of the circuit board 30. First fins 81 to 83 and second fins 91 to 93 are each in a thin-plate shape and protruding toward the one surface of the circuit board 30 are formed on the opposing surface 41 of the casing 40 so as to be integral with the main body 41.

With reference to the thickness direction (the vertical direction) of the circuit board 30, the heights of the first fins 81 to 83 and the second fins 91 to 93 are all equal. With reference to the fitting direction (see an arrow L) of the first connector 60 and of the second connector 70, all of the first fins 81 to 83 are designed so as to be longer than the second fins 91 to 93.

With reference to the widthwise direction (see an arrow W) of the first connector 60 and of the second connector 70, the thicknesses of the first fin 81 to 83 and the second fin 91 to 93 are all equal. The first fin 81 to 83 and the second fin 91 to 93 adjoin to each other in the widthwise direction (see an arrow W).

(Position of First Fin)

Figure 3:
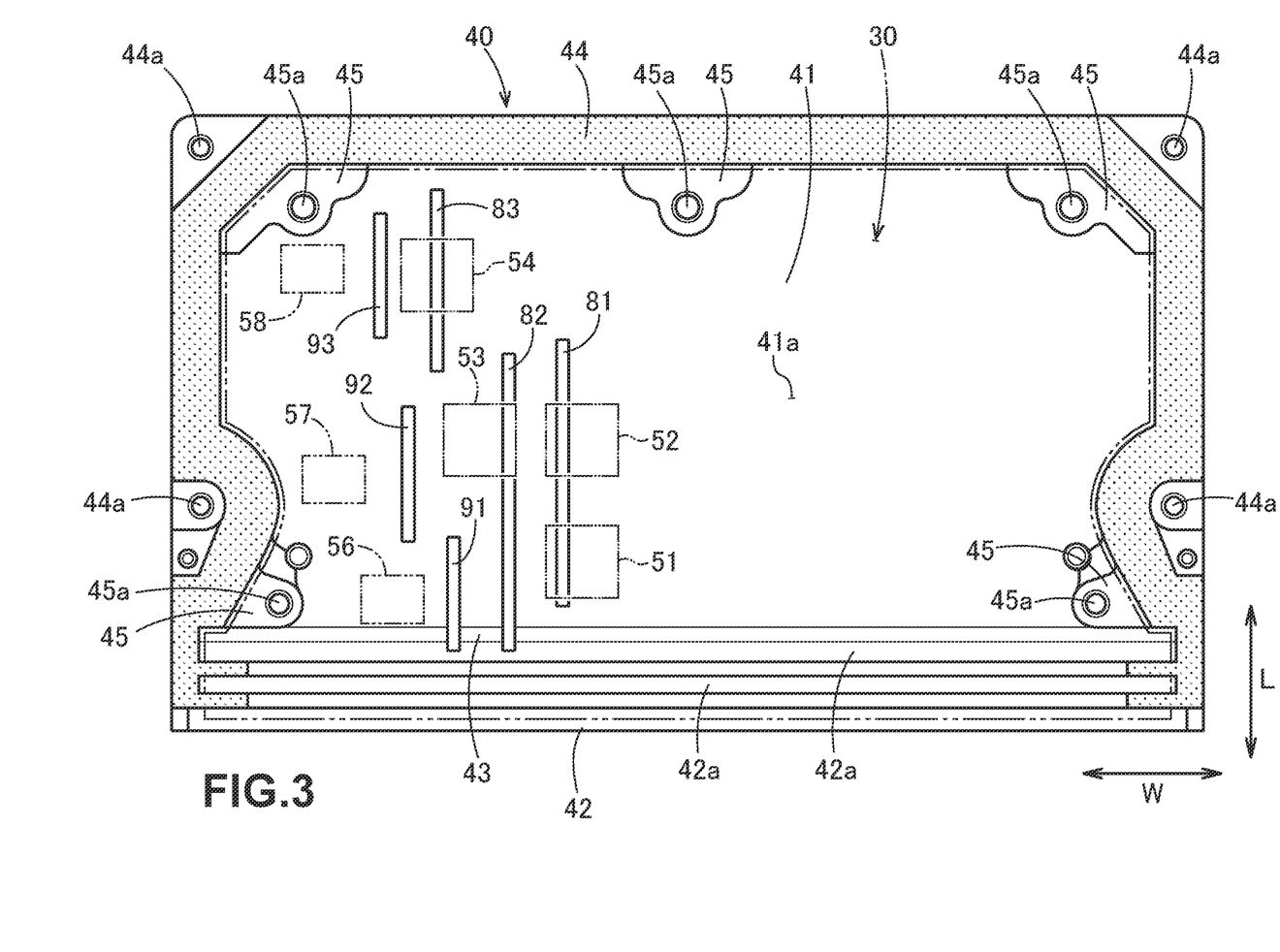
FIG. 3 is a plan view of the circuit board and the casing looked down along a thickness direction of the circuit board illustrated in FIG. 1.

FIG. 3 is a plan view of the circuit board 30 and the casing 40 looked down along the thickness direction of the circuit board 30. In the thickness direction of the circuit board 30, the first fin 81 overlaps the high-heat generating components 51 and 52. The first fin 82 overlaps the heat generating component 53. The first fin 82 is continuously formed from the opposing surface 41 to the step-like portion. The length of the first fin 82 is the longest among the first fins 81 to 83. The first fin 83 overlaps the high-heat generating component 54.

(Position of Second Fin)

The second fin 91 is located between the high-heat generating component 51 and the low-heat generating component 56. The second fin 91 is longer than the low-heat generating component 56 (with reference to the direction of the arrow L). The second fin 91 is continuously formed from the opposing surface 41 to the connecting portion 43. The second fin 92 is located between the high-heat generating component 53 and the low-heat generating component 57. The second fin 92 is longer than the low-heat generating component 57 (with reference to the direction of the arrow L). The second fin 93 is located between the high-heat generating component 54 and the low-heat generating component 58. The second fin 93 is longer than the low-heat generating component 58 (with reference to the direction of the arrow L).

Figure 4:
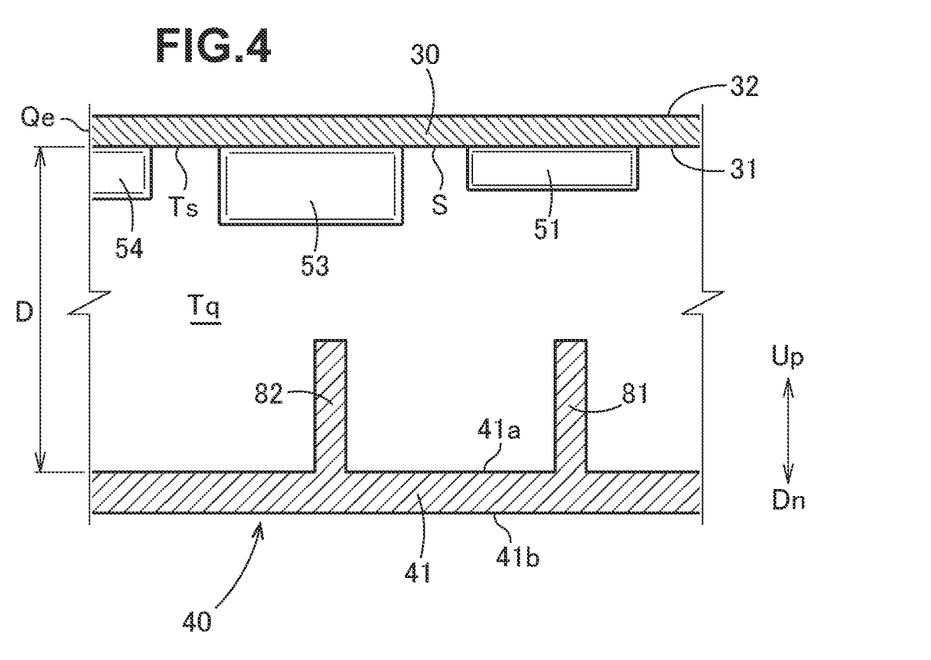
FIG. 4 is a cross-sectional view of a region including a high-heat generating component in the electronic control device as viewed along an insertion direction of a connector illustrated in FIG. 1.
Figure 5:
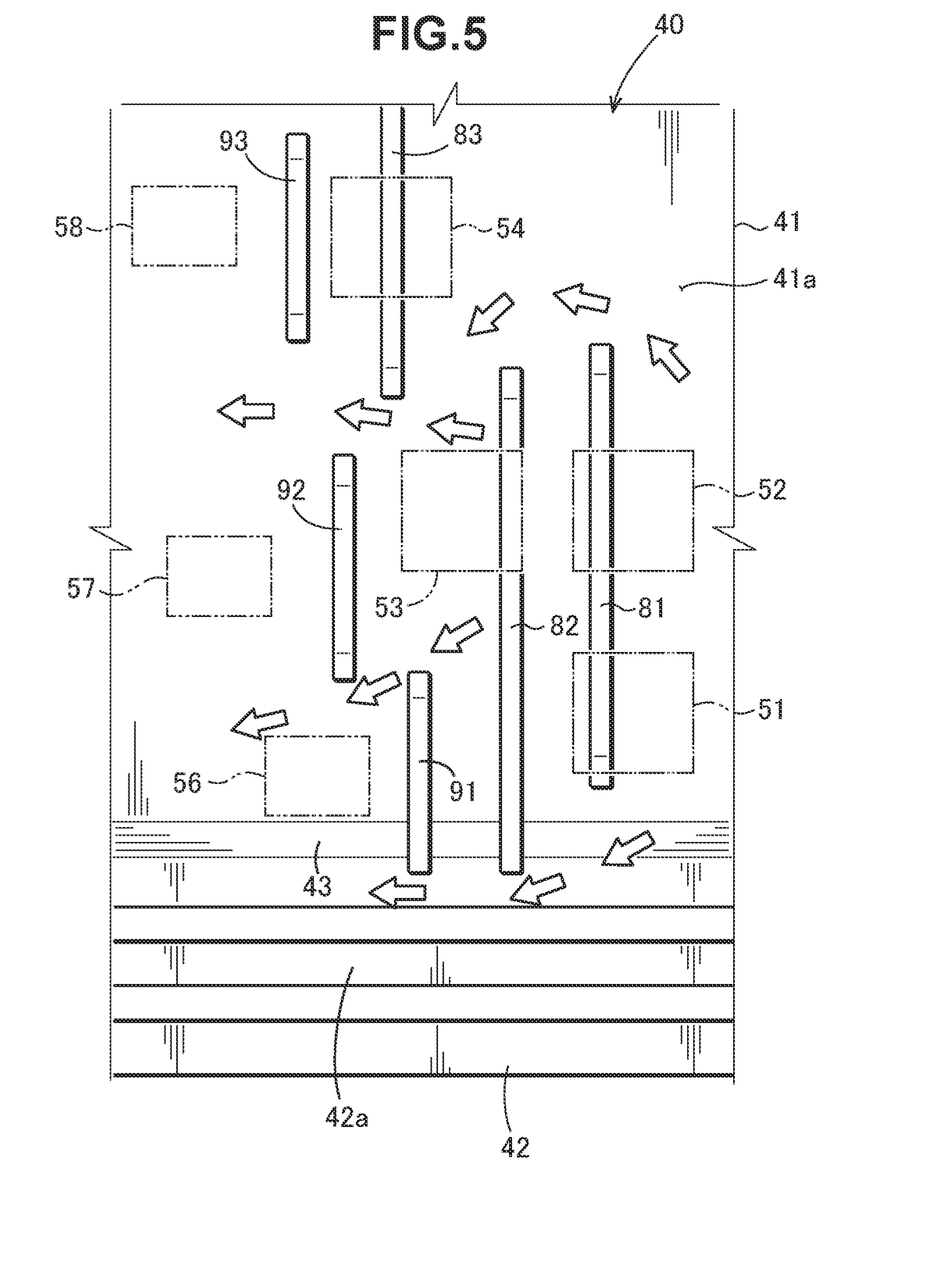
FIG. 5 is a diagram for describing actions of a second fin formed on the casing illustrated in FIG. 3.

With reference to FIG. 4, a clearance D between the opposing surface 41a of the casing 40 and the lower surface 31 of the circuit board 30 is designed in such a way that air in the casing 40 flows as convection flow. In general, a heat flow rate when there is a difference in temperature between a fluid that is flowing as convection flow and an object that contacts the fluid can be calculated from the following formula.

Heat flow rate($W$)=object surface area($m^2$)×convection flow heat transfer coefficient($W/m^2k$)×(object surface temperature($k$)−fluid temperature ($k$)).

Based on a heat transfer coefficient h of air, a surface area S of the lower surface 31 of the circuit board 30, a surface area temperature Ts of the circuit board 30, a temperature Tq of convection air in the casing 40, and a heat dissipation power Qe of the circuit board 30, a clearance D from the lower surface 31 of the circuit board 30 to the casing 40 can be obtained by the following formula (1) that is a modified formula of the above formula.

[Formula 1]

$$D = \frac{h \times S \times (Ts - Tq) \times 3}{Qe \times 2} \quad (1)$$

Advantageous Effects of Embodiment (Easiness of Shape Forming of Casing Due to Fins)

With reference to FIG. 2 and FIG. 3, the casing 40 of the electronic control device 10 has the opposing surface 41 that faces the lower surface 31 of the circuit board 30. The first fins 81 to 83 that protrude toward the one surface of the circuit board 30 are provided on the opposing surface 41 of the casing 40. The first fins 81 to 83 overlap the high-heat generating components 51 to 54 in the thickness direction of the circuit board 30. Hence, heats generated by the high-heat generating components 51 to 54 are transferred to the first fins 81 to 83 located directly below the high-heat generating components 51 to 54, and are dissipated from the main body 41 of the casing 40 to the exterior through the first fins 81 to 83.

The first fins 81 to 83 are each in a thin-plate shape, and the area of the tip surface of each first fins 81 to 83 is small. If a convexity with a tip surface that has a predetermined dimension is provided like Patent Document 1, in order to maintain the easiness of shape forming, it becomes essential to provide a recess in an opposite side. In contrast, the first fins 81 to 83 are each in a thin-plate shape. In order to maintain the easiness of shape forming of the metal casing 40, it is unnecessary to form recesses corresponding to the first fins 81 to 83 in an opposite surface 41b (see FIG. 4, the outer surface of the casing) of the opposing surface 41 on which the first fins 81 to 83 are formed. The opposite surface 41b is a flat surface, simplifying the external shape of the casing 40.

As described above, the electronic control device 10 that includes the casing 40 which has the opposite surface 41b that employs a simple structure, and which has a high heat dissipation performance can be provided.

(Thermal Barrier Effect by Second Fins)

In addition, the second fins 91 to 93 that protrude toward the one surface of the circuit board 30 are provided on the opposing surface 41 of the casing 40. As viewed along the thickness direction of the circuit board 30 (see FIG. 3), the second fin 91 is located between the high-heat generating component 51 and the low-heat generating component 56. The second fin 92 is located between the high-heat generating component 53 and the low-heat generating component 57. The second fin 93 is located between the high-heat generating component 54 and the low-heat generating component 58.

When the dimension of the clearance D (see FIG. 4) is designed so as to cause air in the casing 40 to flow as convection flow, heats generated from the high-heat generating components 51 to 54 flow toward the low-heat generating components 56 to 58. Hence, high-temperature air can be blocked by providing the second fins 91 to 93 between the high-heat generating components 51 to 54 and the low-heat generating components 56 to 58. This suppresses heating of the low-heat generating components 56 to 58.

(Length of First Fin)

With reference to FIG. 3, the lengths of the first fins 81 to 83 are longer than the length of any second fin 91 to 93. Accordingly, the heat dissipation performance of the first fin can be enhanced.

As far as the actions and advantageous effects of the present disclosure are accomplishable, the present disclosure is not limited to the embodiment.

What is claimed is:

1. An electronic control device comprising:
   a circuit board having one surface and an oppositely facing other surface;
   a connector that is attached to the one surface of the circuit board and that is directed toward an external side;
   a heat generating component that is mounted on the one surface to which the connector is attached;
   a metal casing that receives therein the circuit board, said metal casing defining an opening through which said connector extends;
   a cover that is attached to the casing so as to cover the circuit board, said cover having an inner surface facing the other surface of the circuit board,
   wherein the casing comprises an opposing surface that faces the one surface of the circuit board,
   wherein a first fin protrudes from the opposing surface of the casing toward the one surface of the circuit board, and wherein the first fin overlaps the heat generating component in a thickness direction of the circuit board;
   wherein a second fin protrudes from the opposing surface of the casing toward the one surface of the circuit board; and
   as viewed along the thickness direction of the circuit board, the second fin is located between the heat generating component and a low-heat generating component, wherein said low-heat generating component generates lower heat than the heat generating component;
   wherein a length of the first fin is greater than a length of the second fin.

2. The electronic control device according to claim 1, wherein said metal casing includes a main body and a wall portion, the main body providing the opposing surface, said wall portion surrounding the circuit board.

3. The electronic control device according to claim 2, wherein said circuit board is attached to the metal casing.

4. The electronic control device according to claim 3, wherein the casing is attached to the wall portion of the metal casing.

5. The electronic control device according to claim 2, wherein the metal casing includes a support portion that supports the first connector.

6. The electronic control device according to claim 5, wherein said circuit board is attached to the metal casing.

7. The electronic control device according to claim 6, wherein the casing is attached to the wall portion of the metal casing.

* * * * *